(12) United States Patent
Park et al.

(10) Patent No.: US 9,629,260 B2
(45) Date of Patent: Apr. 18, 2017

(54) PRINTED CIRCUIT BOARD AND METHOD OF MANUFACTURING THE SAME

(71) Applicant: SAMSUNG ELECTRO-MECHANICS CO., LTD., Suwon-si (KR)

(72) Inventors: Seung Wook Park, Suwon-si (KR); Young Do Kweon, Suwon-si (KR); Jin Gu Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 135 days.

(21) Appl. No.: 14/169,097

(22) Filed: Jan. 30, 2014

(65) Prior Publication Data
US 2014/0345916 A1 Nov. 27, 2014

(30) Foreign Application Priority Data
May 23, 2013 (KR) .......................... 10-2013-0058533

(51) Int. Cl.
*H05K 1/11* (2006.01)
*H05K 3/42* (2006.01)
(Continued)

(52) U.S. Cl.
CPC ............. *H05K 3/426* (2013.01); *H05K 3/108* (2013.01); *H05K 1/036* (2013.01); *H05K 3/285* (2013.01);
(Continued)

(58) Field of Classification Search
CPC .......... H05K 1/09; H05K 1/036; H05K 1/053; H05K 1/056; H05K 1/115; H05K 1/0272;
(Continued)

(56) References Cited

U.S. PATENT DOCUMENTS

| 4,528,072 A * | 7/1985 | Kurosawa | ............... H05K 3/429 |
| | | | 205/125 |
| 6,316,738 B1 | 11/2001 | Mori | ............................ 174/261 |

(Continued)

FOREIGN PATENT DOCUMENTS

| JP | 06-006018 | 1/1994 |
| JP | 08-321677 | 12/1996 |

(Continued)

OTHER PUBLICATIONS

Japanese Office Action issued Jul. 7, 2015 in counterpart Japanese Application No. 2014-009303 (pp. 1-4 in Japanese; pp. 5-9 in English).

(Continued)

*Primary Examiner* — Timothy Thompson
*Assistant Examiner* — Guillermo Egoavil
(74) *Attorney, Agent, or Firm* — NSIP Law

(57) ABSTRACT

Disclosed herein are a printed circuit board and a method of manufacturing the same. The printed circuit board according to a preferred embodiment of the present invention includes a base substrate; a through via formed to penetrate through the base substrate; and circuit patterns formed on one side and the other side of the base substrate and formed to be thinner than an inner wall of the through via.

8 Claims, 5 Drawing Sheets

(51) Int. Cl.
*H05K 3/10* (2006.01)
*H05K 1/03* (2006.01)
*H05K 3/28* (2006.01)

(52) U.S. Cl.
CPC ............... *H05K 2201/0959* (2013.01); *H05K 2203/1476* (2013.01)

(58) Field of Classification Search
CPC ........ H05K 3/108; H05K 3/285; H05K 3/426; H05K 3/427; H05K 3/429; H05K 3/445; H05K 3/462; H05K 3/0094; H05K 3/4623; H05K 2201/096; H05K 2201/0179; H05K 2201/0195; H05K 2201/0323; H05K 2201/0379; H05K 2201/0959; H05K 2201/09536; H05K 2201/09581; H05K 2201/09563; H05K 2203/072; H05K 2203/135; H05K 2203/0315; H05K 2203/0723; H05K 2203/1476; Y10T 29/49117; Y10T 29/49126; Y10T 29/49155; Y10T 29/49165
USPC ........... 29/830; 174/255, 262, 266; 205/126, 205/125; 427/97.2
See application file for complete search history.

(56) References Cited

U.S. PATENT DOCUMENTS

| | | | | |
|---|---|---|---|---|
| 2007/0240901 A1* | 10/2007 | Okamoto | ............... | H05K 3/445 174/262 |
| 2009/0266586 A1* | 10/2009 | Sato | ............... | H01L 23/49827 174/254 |
| 2009/0297873 A1 | 12/2009 | Yum et al. | | |
| 2011/0120762 A1* | 5/2011 | Kawai | ............... | H05K 3/423 174/264 |
| 2013/0182551 A1* | 7/2013 | Tomita | ............... | G11B 7/121 369/121 |
| 2014/0338965 A1* | 11/2014 | Kajihara | ............... | H05K 3/426 174/266 |

FOREIGN PATENT DOCUMENTS

| | | |
|---|---|---|
| JP | 2000-169998 | 6/2000 |
| JP | 2000169998 A * | 6/2000 |
| JP | 2001-230507 | 8/2001 |
| JP | 2002-009436 | 1/2002 |
| JP | 2002-016332 | 1/2002 |
| JP | 2004-349358 | 12/2004 |
| JP | 2009-290198 A | 12/2009 |
| KR | 10-2010-0063526 | 6/2010 |
| KR | 10-2012-0007444 | 1/2012 |
| KR | 10-2012-0130640 | 12/2012 |
| KR | 20120130640 A * | 12/2012 |

OTHER PUBLICATIONS

Office action dated Oct. 28, 2014 from corresponding JP Patent Application No. 2014-009303 and its English summary by the applicant.

Office action dated Mar. 27, 2014 from corresponding Korean Patent Application No. 10-2013-0058533 and its English summary provided by the applicants.

* cited by examiner

PRINTED CIRCUIT BOARD AND METHOD OF MANUFACTURING THE SAME

CROSS REFERENCE TO RELATED APPLICATION

This application claims the benefit of Korean Patent Application No. 10-2013-0058533, filed on May 23, 2013, entitled "Printed Circuit Board And Method Of Manufacturing The Same" which is hereby incorporated by reference in its entirety into this application.

BACKGROUND OF THE INVENTION

1. Technical Field

The present invention relates to a printed circuit board and a method of manufacturing the same.

2. Description of the Related Art

In general, a printed circuit board is implemented by wiring a copper foil on one surface or both surfaces of a board made of various kinds of thermosetting synthetic resins, fixedly disposing integrated circuits (ICs) or electronic components on the board, and implementing electrical wirings therebetween and then coating the electrical wirings with an insulator. With the recent development of electronic industries, a demand for multi-functional and light and small electronic components has rapidly increased. Therefore, there is a need to increase a wiring density of a printed circuit board on which the electronic components are mounted and reduce a thickness thereof.

The printed circuit board may include through vias. The through via is to connect interlayer wirings on a double-sided printed circuit board or a multilayered printed circuit board. In the related art, circuit patterns and through vias are simultaneously formed on both surfaces of the printed circuit board, so that a thickness of the circuit pattern is the same as that of an inner wall of the through via (U.S. Pat. No. 6,316,738). In this case, as a plated thickness is reduced to achieve miniaturization of the circuit pattern, a thickness of the inner wall of the through via is also reduced, such that reliability of power signal transmission may be reduced. Further, as the plated thickness is increased to make the thickness of the inner wall of the through via sufficiently thick, the thickness of the circuit pattern is also formed to be thicker, such that it is difficult to implement fine patterning.

SUMMARY OF THE INVENTION

The present invention has been made in an effort to provide a printed circuit board including a through via having an inner wall having a thickness thicker than that of a circuit pattern and a method of manufacturing the same.

Further, the present invention has been made in an effort to provide a printed circuit board capable of simultaneously implementing a fine circuit pattern and power signal transmission and a method of manufacturing the same.

According to a preferred embodiment of the present invention, there is provided a printed circuit board, including: a base substrate; a through via formed to penetrate through the base substrate; and circuit patterns formed on one side and the other side of the base substrate and formed to be thinner than an inner wall of the through via.

The printed circuit board may further include: insulating layers formed on the through via and the circuit pattern.

An inside of the through via may be filled with an insulating material.

The circuit pattern formed on one side of the base substrate may be configured of a first seed layer and a first plating layer.

The circuit pattern formed on the other side of the base substrate may be configured of a third seed layer and a second plating layer.

The inner wall of the through via may be configured of a second seed layer and a plating layer.

The plating layer may be formed to have a double structure including the first plating layer and a second plating layer.

The printed circuit board may further include insulating films formed at both sides of the base substrate.

The insulating film may be made of at least one of polyimide, epoxy resin, acrylate resin, benzocyclobutene (BCB), silicones, polybenzoxazole (PBO), and ajinomoto build up film (ABF).

According to another preferred embodiment of the present invention, there is provided a method of manufacturing a printed circuit board, including: providing a base substrate; forming a through via hole on the base substrate; forming a first circuit pattern by forming a first plating layer on one side of the base substrate and an inner wall of the through via hole; and forming a second circuit pattern and a through via by forming a second plating layer on the other side of the base substrate and on the first plating layer of the through via hole.

The forming of the first circuit pattern may include: forming a first seed layer on one side of the base substrate; forming a second seed layer on the inner wall of the through via hole; forming a first plating resist formed with a first opening part on the first seed layer; forming a first plating layer in the first opening part and the inner wall of the through via hole; and removing the first plating resist.

The first seed layer may be formed by a sputtering method.

The second seed layer may be formed by an electroless plating method.

The first plating layer may be formed by an electroplating method.

The forming of the second circuit pattern may include: forming a third seed layer on the other side of the base substrate; forming a second plating resist formed with a second opening part on the third seed layer; forming a second plating layer in the second opening part and the first plating layer of the through via hole; and removing the second plating resist.

The third seed layer may be formed by a sputtering method.

The second plating layer may be formed by an electroplating method.

An inner wall of the through via hole may be formed to be thicker than the first circuit pattern and the second circuit pattern.

The method of manufacturing a printed circuit board may further include forming insulating layers in the first circuit pattern and the second circuit pattern.

An inside of the through via may be filled with an insulating material.

The method of manufacturing a printed circuit board may further comprising: forming the insulating films at both sides of the base substrate in the providing of the base substrate.

The insulating film may be made of at least one of polyimide, epoxy resin, acrylate resin, benzocyclobutene (BCB), silicones, polybenzoxazole (PBO), and ajinomoto build up film (ABF).

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
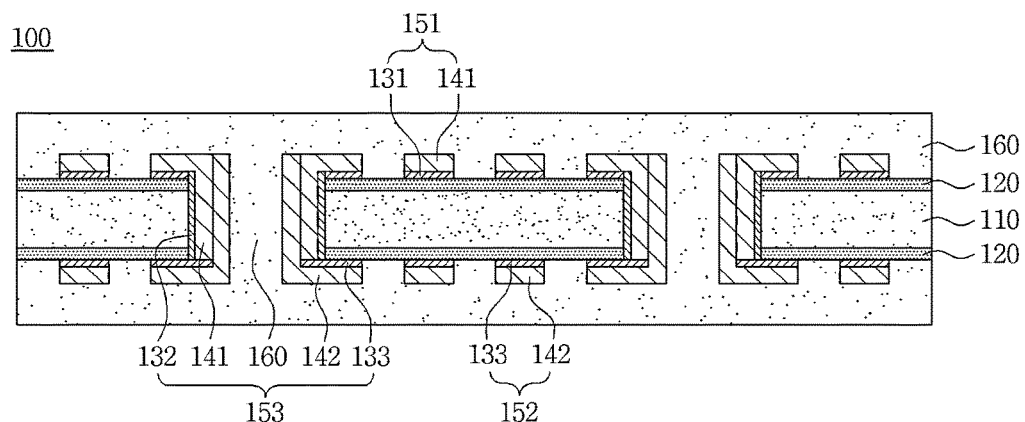
FIG. 1 is an exemplified diagram illustrating a printed circuit board according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Printed Circuit Board

FIG. 1 is an exemplified diagram illustrating a printed circuit board according to a preferred embodiment of the present invention.

Referring to FIG. 1, a printed circuit board 100 includes a base substrate 110, insulating films 120, a first circuit pattern 151, a second circuit pattern 152, a through via 153, and insulating layers 160.

The base substrate 110 may be made of a composite polymer resin generally used as an interlayer insulating material. For example, the base substrate 110 is made of a prepreg, and thus the printed circuit board may be manufactured to be thinner. Alternatively, the base substrate 110 may be made of an ajinomoto build up film (ABF) to easily implement a fine circuit. In addition, the base substrate may use an epoxy based resin, such as FR-4, bismaleimide triazine (BT), and the like, but the preferred embodiment of the present invention is not particularly limited thereto. Further, as the base substrate 110, a copper clad laminate (CCL) may be used. The preferred embodiment of the present invention illustrates that the base substrate 110 is formed of a single insulating layer, but is not limited thereto. That is, the base substrate 110 may be a buildup layer which is configured of a multilayered insulating layer or a single layer insulating layer, a circuit layer, and a via.

The insulating films 120 may be formed on both surfaces of the base substrate 110 to improve flatness of the base substrate 110. Therefore, the insulating film 120 may be made of an insulating material having low illumination. For example, the insulating film 120 may be made of at least one of polyimide, epoxy resin, acrylate resin, benzocyclobutene (BCB), silicones, polybenzoxazole (PBO), and ajinomoto build up film (ABF). As such, when the flatness of the base substrate 110 is improved by forming the insulating film 120 thereon, a fine pattern may be easily formed. In the embodiment of the present invention, the insulating film 120 is formed on the base substrate 110, which may be optionally omitted by a person having an ordinary skill in the art to which the present invention pertains.

A first circuit pattern 151 may be formed on one side of the base substrate 110. The first circuit pattern 151 may be configured of a first seed layer 131 and a first plating layer 141. The first plating layer 141 may be formed on the first seed layer 131 which is formed on one side of the base substrate 110. The first seed layer 131 and the first plating layer 141 may be made of an electrically conductive material. For example, the first seed layer 131 and the first plating layer 141 may be made of materials generally used to form the circuit patterns, such as copper, nickel, gold, and the like. The first seed layer 131 and the first plating layer 141 may be made of the same material or made of different materials.

The second circuit pattern 152 may be formed on the other side of the base substrate 110. The second circuit pattern 152 may be configured of a third seed layer 133 and a second plating layer 142. The second plating layer 142 may be formed on the third seed layer 133 which is formed on the other side of the base substrate 110. The third seed layer 133 and the second plating layer 142 may be made of an electrically conductive material. For example, the third seed layer 133 and the second plating layer 142 may be made of materials generally used to form the circuit patterns, such as copper, nickel, gold, and the like. The third seed layer 133 and the second plating layer 142 may be made of the same material or made of different materials. Herein, the first plating layer 141 and the second plating layer 142 are not formed simultaneously but may be formed individually.

The through via 153 may be formed to penetrate through the base substrate 110. An inner wall of the through via 153 may be configured of a second seed layer 132, the first plating layer 141, and the second plating layer 142. The first plating layer 141 configuring the inner wall of the through via 153 may be formed on the second seed layer 132. The first plating layer 141 of the through via 153 may be simultaneously formed with the first plating layer 141 of the first circuit pattern 151. Further, the second plating layer 142 of the through via 153 may be simultaneously formed with the second plating layer 142 of the second circuit pattern 152. That is, the inner wall of the through via 153 may be formed to have a double structure of the first plating layer 141 and the second plating layer 142. The inner wall of the through via 153 having the double structure may be formed thicker than the thickness of the first circuit pattern 151 and the second circuit pattern 152. An inside of the through via 153 may be filled with the insulating layer 160. Alternatively, the inside of the through via 153 may be filled with an insulating material which is a material different from the insulating layer 160.

The insulating layers 160 may be formed on both sides of the base substrate 110. Alternatively, the insulating layer 160 may also be formed in a through via hole 115. The insulating layer 160 may be made of a composite polymer resin generally used as an interlayer insulating material. For example, the insulating layer 160 may be made of an epoxy based non-photosensitive resin, such as prepreg, ajinomoto build up film (ABF), or such as FR-4, bismaleimide triazine (BT), and the like. Further, the insulating layer 160 may be made of a photosensitive resin including at least one of polyimide, epoxy resin, acrylate resin, benzocyclobutene (BCB), silicones, and polybenzoxazole (PBO).

The printed circuit board 100 according to the preferred embodiment of the present invention includes the through via 153 having an inner wall of the thickness thicker than that of the first circuit pattern 151 and the second circuit pattern 152. That is, even when the first circuit pattern 151 and the second circuit pattern 152 are implemented to have a fine pattern, the inner wall of the through via 153 may be formed to have a double structure to have a sufficient thickness for power signal transmission.

Method of Manufacturing Printed Circuit Board

FIGS. 2 to 14 are views illustrating a method of manufacturing a printed circuit board according to the preferred embodiment of the present invention.

Figure 2:
FIGS. 2 to 14 are views illustrating a method of manufacturing a printed circuit board according to the preferred embodiment of the present invention.

Referring to FIG. 2, the base substrate 110 is provided. The base substrate 110 may be made of a composite polymer resin generally used as an interlayer insulating material. For example, the base substrate 110 is made of a prepreg, and thus the printed circuit board may be manufactured to be thinner. Alternatively, the base substrate 110 may be made of an ajinomoto build up film (ABF) to easily implement a fine circuit. In addition, the base substrate may use an epoxy based resin, such as FR-4, bismaleimide triazine (BT), and the like, but the preferred embodiment of the present invention is not particularly limited thereto. Further, as the base substrate 110, the copper clad laminate (CCL) may be used. The preferred embodiment of the present invention illustrates that the base substrate 110 is formed of a single insulating layer, but is not limited thereto. That is, the base substrate 110 may be a buildup layer which is configured of a multilayered insulating layer or a single layer insulating layer, a circuit layer, and a via.

In addition, the base substrate 110 may be provided with the insulating film 120. The insulating films 120 may be formed on both surfaces of the base substrate 110 to improve the flatness of the base substrate 110. Therefore, the insulating film 120 may be made of an insulating material having low illumination. For example, the insulating film 120 may be made of at least one of polyimide, epoxy resin, acrylate resin, benzocyclobutene (BCB), silicones, polybenzoxazole (PBO), and ajinomoto build up film (ABF). As such, when the flatness of the base substrate 110 is improved by forming the insulating film 120 thereon, a fine pattern may be easily formed. In the embodiment of the present invention, the insulating film 120 is formed on the base substrate 110, which may be optionally omitted by a person having an ordinary skill in the art to which the present invention pertains.

The base substrate 110 may be provided with the through via hole 115. According to the preferred embodiment of the present invention, the through via hole 115 may be formed to penetrate through both surfaces of the base substrate. Later, the inside of the so formed through via hole 115 may be provided with the through via for electrically conducting between the circuit layers formed on both surfaces of the base substrate. For example, the through via hole 115 may be formed by physical methods, such as CNC drill, laser drill, and the like.

Figure 3:
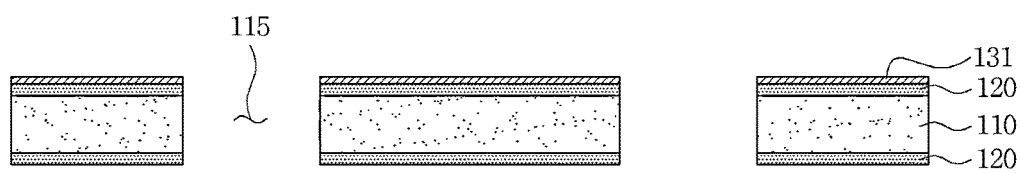

Referring to FIG. 3, the first seed layer 131 may be formed on one side of the base substrate 110. A method of forming the first seed layer 131 is not particularly limited and may be formed by an ordinary method known to those skilled in the art. According to the preferred embodiment of the present invention, the first seed layer 131 may be formed by a sputtering method. The first seed layer 131 formed by the sputtering method may be formed to improve the adhesion to the circuit pattern to be formed later. Further, as the first seed layer 131 is formed by the sputtering method, the adhesion may be implemented even by the low illumination, thereby easily forming the fine pattern. The first seed layer 131 may be made of a conductive material. For example, the first seed layer 131 may be made of materials generally used to form the circuit patterns, such as copper, nickel, gold, and the like.

Figure 4:
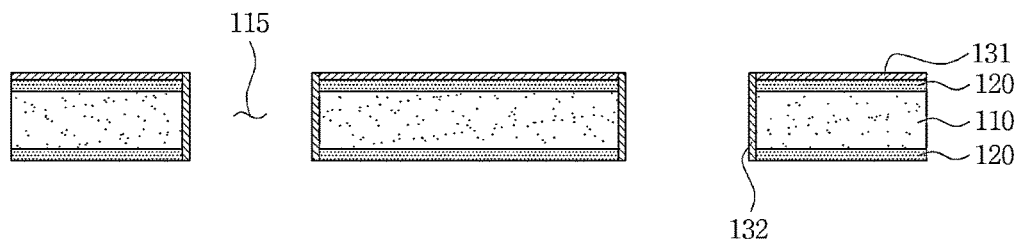

Referring to FIG. 4, the inner wall of the through via hole 115 may be provided with the second seed layer 132. According to the preferred embodiment of the present invention, the second seed layer 132 may be formed by an electroless plating method. The second seed layer 132 may be made of a conductive material. For example, the second seed layer 132 may be made of materials generally used to form the circuit patterns, such as copper, nickel, gold, and the like.

Figure 5:
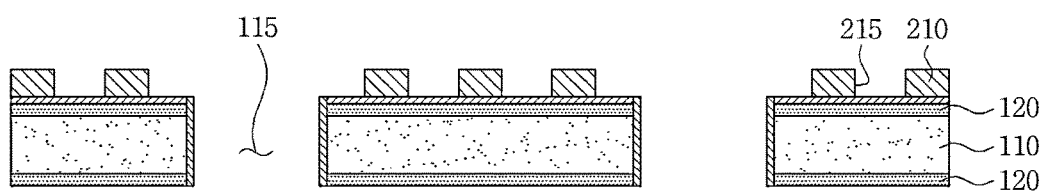

Referring to FIG. 5, the first seed layer 131 may be provided with a first plating resist 210. The first plating resist 210 may be patterned with a first opening part 215. The first opening part 215 may be formed to open a region in which the circuit patterns are formed and a region in which the through vias are formed.

Figure 6:
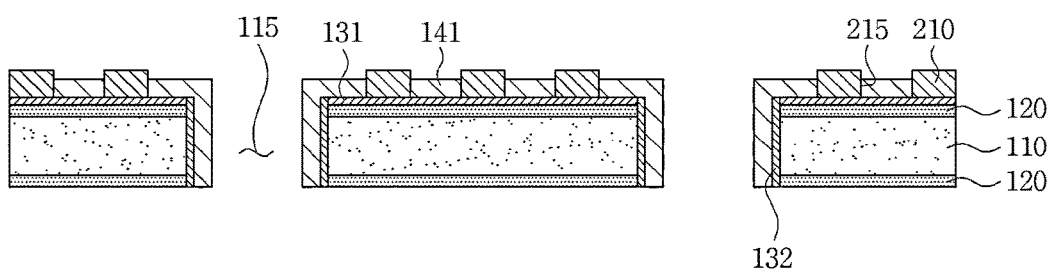

Referring to FIG. 6, the first plating layer 141 may be formed. The first plating layer 141 may be formed in the first opening part 215 of the first plating resist 210. That is, the first plating layer 141 may be formed on the first seed layer 131 exposed by the first opening part 215 of the first plating resist 210 and the second seed layer 132 of the through via hole 115. The first plating layer 141 may be formed by an electroplating method. The first plating layer 141 may be made of an electrically conductive material. For example, the first plating layer 141 may be made of materials generally used to form the circuit patterns, such as copper, nickel, gold, and the like.

Figure 7:
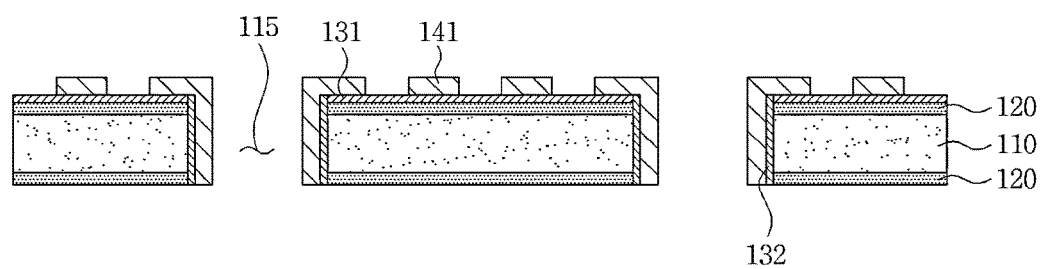

Referring to FIG. 7, the first plating resist 210 (FIG. 6) may be removed. As the first plating resist 210 (FIG. 6) is removed, a part of the first seed layer 131 may be exposed to the outside.

Figure 8:
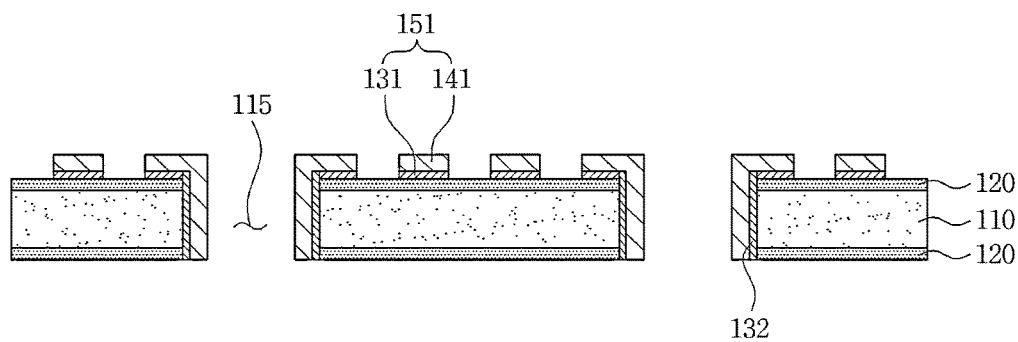

Referring to FIG. 8, as the first plating resist 210 (FIG. 6) is removed, the exposed first seed layer 131 may be removed. Therefore, the first circuit pattern 151 configured of the first seed layer 131 and the first plating layer 141 may be formed. Further, the through via hole 115 may be primarily configured of the second seed layer 132 and the first plating layer 141.

Figure 9:
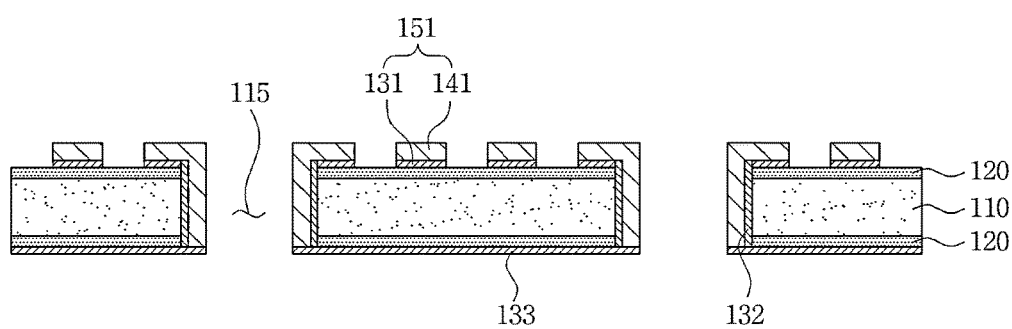

Referring to FIG. 9, a third seed layer 133 may be formed on the other side of the base substrate 110. A method of forming the third seed layer 133 is not particularly limited and may be formed by an ordinary method known to those skilled in the art. According to the preferred embodiment of the present invention, the third seed layer 133 may be formed by the sputtering method. The third seed layer 131 formed by the sputtering method may be formed to improve an adhesion to the circuit pattern to be formed later. Further, as the third seed layer 131 is formed by the sputtering method, the adhesion may be implemented even by the low illumination, thereby easily forming the fine pattern. The third seed layer 133 may be made of an electrically conductive material. For example, the third seed layer 133 may be made of materials generally used to form the circuit patterns, such as copper, nickel, gold, and the like.

According to the preferred embodiment of the present invention, the third seed layer 133 is formed under the base substrate 110. However, processes after the third seed layer 133 is formed may be performed on the base substrate 110 after the base substrate 110 is inverted.

Further, the third seed layer 133 may be formed at the same when the first seed layer 131 is formed. That is, the first seed layers 131 may be simultaneously formed at both sides of the base substrate 110. As such, when the first seed layers 131 are simultaneously formed at both sides of the base substrate 110, a process of forming the third seed layer 133 individually may be omitted.

Figure 10:
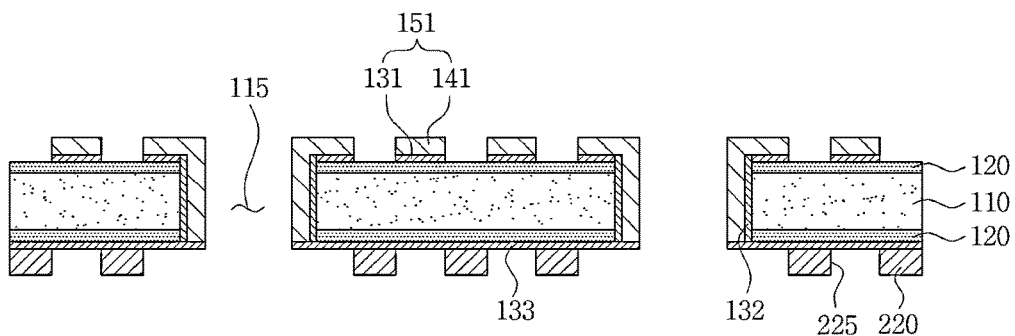

Referring to FIG. 10, a second plating resist 220 may be formed on the third seed layer 133. The second plating resist 220 may be patterned with a second opening part 225. The second opening part 225 may be formed to open a region in which the circuit patterns are formed and a region in which the through vias are formed.

Figure 11:
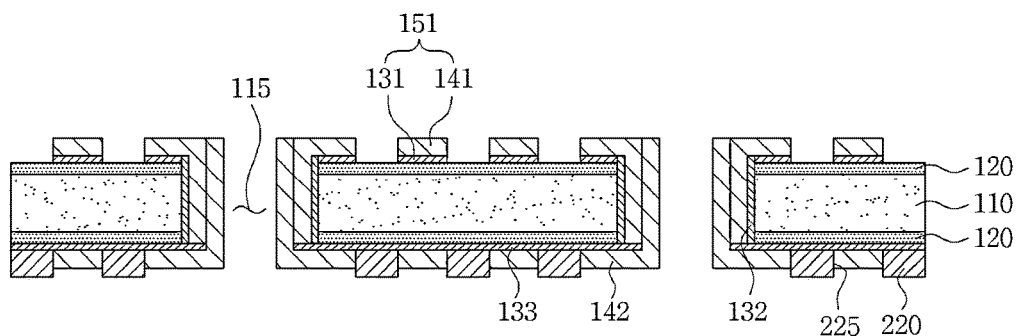

Referring to FIG. 11, the second plating layer 142 may be formed. The second plating layer 142 may be formed in the second opening part 225 of the second plating resist 220. That is, the second plating layer 142 may be formed on the third seed layer 133 exposed by the second opening part 225 of the second plating resist 220 and the first plating layer 141 of the through via hole 115 The second plating layer 142 may be formed by an electroplating method. The second plating layer 142 may be made of an electrically conductive material. For example, the second plating layer 142 may be made of materials generally used to form the circuit patterns, such as copper, nickel, gold, and the like.

Figure 12:
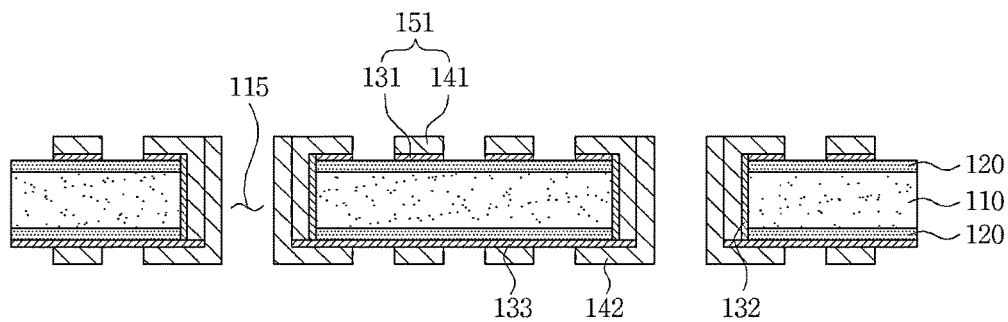

Referring to FIG. 12, the second plating resist 220 (FIG. 11) may be removed. As the second plating resist 220 (FIG. 11) is removed, a part of the third seed layer 133 may be exposed to the outside.

Figure 13:
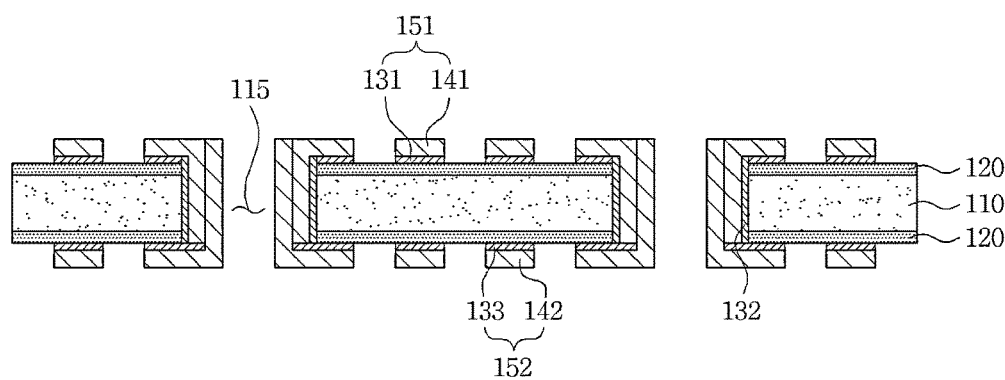

Referring to FIG. 13, as the second plating resist 220 (FIG. 11) is removed, the exposed third seed layer 133 may be removed. Therefore, the second circuit pattern 152 configured of the third seed layer 133 and the second plating layer 142 may be formed. Further, the through via hole 115 may have a thick inner wall by further forming the second plating layer 142 on the second seed layer 132 and the first plating layer 141 which are primarily formed.

Figure 14:
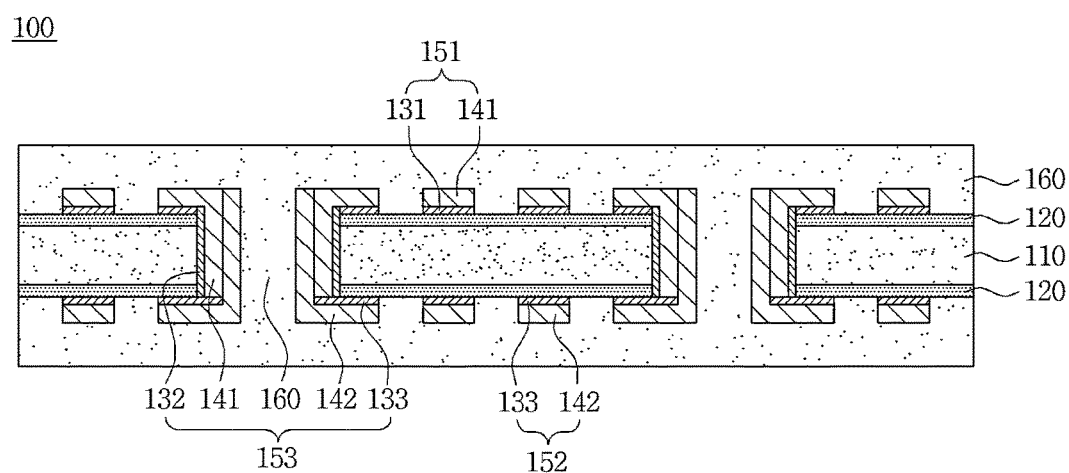

Referring to FIG. 14, the insulating layer 160 may be formed. The insulating layer 160 may be made of a composite polymer resin generally used as an interlayer insulating material. For example, the insulating layer 160 may be made of an epoxy based non-photosensitive resin, such as prepreg, ajinomoto build up film (ABF), or such as FR-4, bismaleimide triazine (BT), and the like. Further, the insulating layer 160 may be made of a photosensitive resin including at least one of polyimide, epoxy resin, acrylate resin, benzocyclobutene (BCB), silicones, and polybenzoxazole (PBO).

According to the preferred embodiment of the present invention, the insulating layers 160 may be formed at both sides of the base substrate 110 and in the through via hole 115. Alternatively, although not illustrated in the present invention, after the inside of the through via hole 115 is filled with an insulating material of other materials, the insulating layers 160 may be formed at both sides of the base substrate 110. As such, as the inside of the through via hole 115 is filled with the insulating layer 160 or the insulating material (not illustrated), the through via 153 may be formed.

According to the preferred embodiment of the present invention, the first circuit pattern 151 and the second circuit pattern 152 may be formed individually. In this case, when the plating for forming the first circuit pattern 151 and the second circuit pattern 152 is performed, the inner wall of the through via 153 may also be plated. Therefore, the inner wall of the through via 153 is plated double, and thus may have a thicker thickness. Therefore, the method of manufacturing a printed circuit board according to the preferred embodiment of the present invention can implement the fine pattern and at the same time, implement the through via 153 having a sufficient thickness for the power signal transmission.

As set forth above, according to the printed circuit board and the method of manufacturing a printed circuit board according to the preferred embodiments of the present invention, it is possible to simultaneously implement the fine circuit pattern and the reliable power signal transmission.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A printed circuit board, comprising:
   a base substrate;
   a through via formed to penetrate through the base substrate; and
   circuit patterns formed on one side and another side of the base substrate and formed to be thinner than an inner wall of the through via,
   wherein the inner wall of the through via comprises at least one seed layer and a plurality of plating layers, and
   wherein insulating layers are formed on the through via and the circuit patterns to entirely cover the through via and the circuit patterns.

2. The printed circuit board as set forth in claim 1, wherein an inside of the through via is filled with an insulating material.

3. The printed circuit board as set forth in claim 1, wherein the circuit pattern formed on one side of the base substrate is configured of a first seed layer and a first plating layer.

4. The printed circuit board as set forth in claim 1, wherein the circuit pattern formed on the other side of the base substrate is configured of a third seed layer and a second plating layer.

5. The printed circuit board as set forth in claim 1, wherein the inner wall of the through via is configured of a second seed layer and the plurality of plating layers.

6. The printed circuit board as set forth in claim 5, wherein the plurality of plating layers is formed to have a double structure including a first plating layer and a second plating layer.

7. The printed circuit board as set forth in claim 1, further comprising:
   insulating films formed at both sides of the base substrate.

8. The printed circuit board as set forth in claim 7, wherein the insulating film is made of at least one of polyimide, epoxy resin, acrylate resin, benzocyclobutene (BCB), silicones, polybenzoxazole (PBO), and ajinomoto build up film (ABF).

* * * * *